Aug. 1, 1961 R. A. GUDMUNDSEN 2,994,810

AUXILIARY EMITTER TRANSISTOR

Filed Nov. 4, 1955

RICHARD A. GUDMUNDSEN,
INVENTOR

BY Henry Heyman
ATTORNEY

United States Patent Office 2,994,810
Patented Aug. 1, 1961

2,994,810

AUXILIARY EMITTER TRANSISTOR

Richard A. Gudmundsen, Inglewood, Calif., assignor to Hughes Aircraft Company, Culver City, Calif., a corporation of Delaware Filed Nov. 4, 1955, Ser. No. 544,960
1 Claim. (Cl. 317—235)

This invention relates to transistors and more particularly to a junction transistor having an auxiliary emitter.

Transistors may be classified as either of the point-contact type or the junction type. The present invention deals with the latter type of transistor, which may be considered a semiconductor triode. In this type of transistor the emitter and collector rectifying barriers are produced by creating, in an N- or P-type specimen of semiconductor material, alternate regions of opposite conductivity type.

Semiconductor materials such as germanium, silicon, germanium-silicon alloys, indium-antimonide, gallium-antimonide, aluminum-antimonide, indium-arsenide, gallium-arsenide, gallium-phosphorus alloys, and indium-phosphorus alloys, or others have been found to be extremely useful in electrical translating devices.

Basic to the theory of operation of semiconductor devices is the concept that current may be carried in two distinctly different manners, namely, "conduction by electrons" or "excess electron conduction," and "conduction by holes" or "deficit electron conduction."

The fact that electrical conductivity by both of these processes may occur simultaneously and separately in a semiconductor specimen affords a basis for explaining the electrical behavior of semiconductor devices. One manner in which the conductivity of a semiconductor specimen may be established is by the addition of "active impurities" to the semiconductor material.

In the semiconductor art, the term "active impurities" is used to denote those impurities which affect the electrical characteristics of a semiconductor material as distinguished from other impurities which have no appreciable effect upon these characteristics. Generally, active impurities are added intentionally to semiconductor material for producing single crystals having predetermined electrical characteristics.

Active impurities are classified as either donors, such as antimony, arsenic, bismuth, and phosphorus, and acceptors, such as indium, gallium, thallium, boron, and aluminum. A region of semiconductor material containing an excess of donor impurities and yielding an excess of free electrons is considered to be an impurity-doped N-type region. An impurity-doped P-type region is one containing an excess of impurities resulting in a deficit of electrons, or stated differently, an excess of holes. In other words, an N-type region is one characterized by electron conductivity, whereas a P-type region is one characterized by hole conductivity.

When a continuous, solid specimen such as a crystal of semiconductor material has an N-type region adjacent a P-type region the boundary between the two regions is termed a P-N or an N-P junction, or simply a junction.

A transistor has at least two such junctions; if a P-type conductivity region separates two N-type conductivity regions it is termed an N-P-N transistor. Alternatively, if an N-type conductivity region separates two P-type conductivity regions it is termed a P-N-P transistor. The present invention is clearly applicable to both, but for the sake of clarity and simplicity will be discussed with reference to a P-N-P device.

In the operation of a P-N-P transistor the emitter is biased in the forward direction, i.e., positively, and injects holes into the N-type base region, the collector being biased in the back direction, i.e., negatively, to collect these holes. The collection mechanism is such that holes arriving in the neighborhood of the negatively-biased collector will allow additional electrons to flow from the collector to the base. Thus, a given change in the emitter current will cause a change in the collector current and the current amplification factor $\alpha$ (alpha) of a transistor is defined as the change of collector current with a change in emitter current at a constant value of collector-to-base voltage.

Since only those holes which are injected into the base region by the emitter and which arrive at the collector produce an effect on the collector current it is usual to express $\alpha$ as a product of three factors: $\alpha=\alpha^*\beta\gamma$, where $\alpha^*$ is the collection efficiency of the collector or the increase in collector current per unit increase of hole current to the collector at a constant collector voltage, $\beta$ (beta) is the transport efficiency of the base region, and $\gamma$ (gamma) is the hole injection efficiency of the emitter.

In an effort to increase the $\alpha$ of a transistor it is at once apparent that an increase in transport efficiency will allow more holes to traverse the base region and hence reach the collector, i.e., the increase of $\beta$ will result in an increase of $\alpha$.

The present invention is concerned with a novel construction for a semiconductor transistor which is reversible and has a high transport efficiency $\beta$.

It is therefore an object of this invention to provide a reversible semiconductor transistor which has a relatively high $\alpha$.

Another object of this invention is to provide a reversible transistor whose $\alpha$ may be increased in a controlled manner by increasing $\beta$ thus decreasing the lateral diffusion of hole current from the emitter within the base.

According to one embodiment of the present invention a fused-junction transistor as hereinabove described has provided about the conventional or standard emitter region a second or auxiliary emitter which generally may be in the shape of a ring. In operation both the standard emitter and the auxiliary emitter are biased in the forward direction. Only the standard emitter has an input signal applied thereto, the second or auxiliary emitter being provided for the sole purpose of affecting the physical parameters of the device in a manner as will be explained hereinafter.

The novel features which are believed to be characteristic of the invention, both as to its organization and method of operation, together with further objects and advantages thereof, will be better understood from the following description considered in connection with the accompanying drawing in which the invention is illustrated by way of example. It is to be expressly understood, however, that the drawing is for the purpose of illustration and description only, and is not intended as a definition of the limits of the invention.

For the purpose of clarity and convenience this invention will be primarily discussed in connection with a fused-junction semiconductor transistor in which the base region is of N-type conductivity germanium separated by two P-type regions forming the emitter and collector regions. It is to be expressly understood, however, that the invention is equally applicable to the utilization of a P-type germanium crystal separating two N-type conductivity regions, of N- or P-type silicon crystals, or any other previously mentioned semiconductor material.

Figure 1:
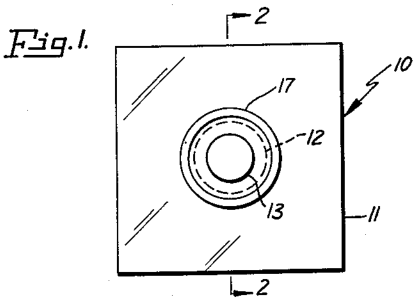
FIG. 1 is a plan view of a transistor which may be operated according to the present invention.

Referring now to the drawing, wherein like reference characters designate like parts throughout the various figures, there is shown in FIG. 1 a plan view of functional portions of a transistor which may be operated in accordance with the present invention. In FIG. 1 the transistor 10 is shown only schematically and is greatly enlarged in size. An example of a packaged transistor is disclosed and described in co-pending U.S. patent application Serial No. 496,554 by Warren P. Waters and Richard A. Gudmundsen, filed March 3, 1954, now U.S. Patent 2,854,610, for "Semiconductor Transistor Device" and assigned to the same assignee as is the present application.

The presently preferred embodiment of the transistor 10 of the invention comprises an N-type germanium crystal body 11 having P-type fused junction regions on opposed surfaces thereof. Transistor 10 may be formed by fusing an indium pellet 12 to one surface of an N-type germanium wafer 11, wafer 11 providing the base region of the completed transistor. The indium pellet 12 forms the collector and may be fused to the surface of the germanium body 11 by any method known to the art.

Figure 2:
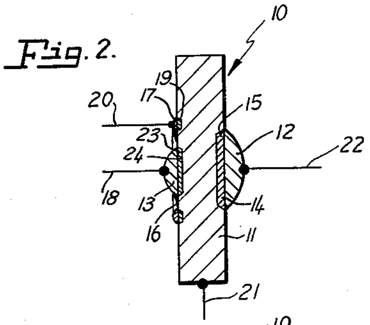
FIG. 2 is a cross-sectional view of the device shown in FIG. 1 taken through line 2—2 of FIG. 1.

An emitter pellet 13 which may also be made of indium may be fused to the surface opposite collector region 12 in the same manner as is pellet 12 to produce an emitter region 23 resulting in a P-N junction 24 as shown in FIG. 2. In this embodiment the collector region is purposefully made larger than the emitter to permit more efficient hole collection.

During the fusion operations of the collector the temperature of the germanium body 11 and the pellet 12 is raised to approximately 525° C. This heat melts the indium pellet 12 which in turn melts or dissolves a region 14 of the crystal 11 thereby permitting indium atoms from the pellet 12 together with the dissolved germanium atoms to form an indium-germanium alloy which upon cooling recrystallizes to produce a strongly acceptor impurity-doped region at 14 in N-type crystal 11 resulting in a collector P-N junction 15. In a similar manner signal emitter region 23 may be produced.

A second or auxiliary emitter region 16 is produced which is made in the form of a ring disposed about and entirely surrounding the first emitter region 23 by the use of a circular indium pellet 17. Thereby P-N junction 19 is produced between N-type base 11 and P-type emitter 16.

First emitter electrode 18 is ohmically connected to pellet 13. Pellet 17 has an electrode 20 ohmically connected thereto which is the auxiliary emitter electrode. Further, base electrode 21 is ohmically connected to base region 11, and collector electrode 22 is ohmically connected to collector pellet 12. The operation of the device shown in FIGS. 1 and 2 will be explained with reference to FIG. 5.

Figure 3:
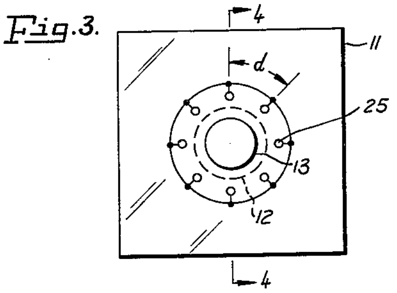
FIG. 3 is a plan view of another embodiment of a transistor which illustrates the operation of a device of the invention.
Figure 4:
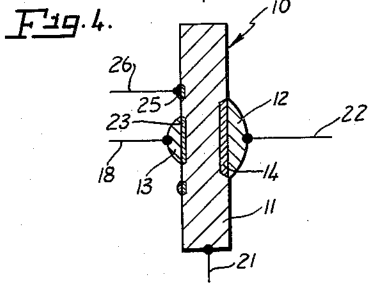
FIG. 4 is a cross-sectional view of the device shown in FIG. 3 taken through line 4—4 of FIG. 3.

In FIGS. 3 and 4 there are shown two views of alternative functional portions of the present invention. The only difference between this device and that shown in FIGS. 1 and 2 is that herein the auxiliary emitter region, instead of being a continuous ring consists of a circularly arranged series of substantially circular auxiliary emitter regions 25 all electrically connected to auxiliary emitter electrode 26 and concentrically disposed about signal emitter 23 to substantially encircle the same. These regions 25 may be spaced any distance *d* apart, which distance *d* is less than a diffusion length. A diffusion length may be defined as the average distance which minority carriers diffuse between their generation and recombination in a homogenous semiconductor.

Figures 5, 6:
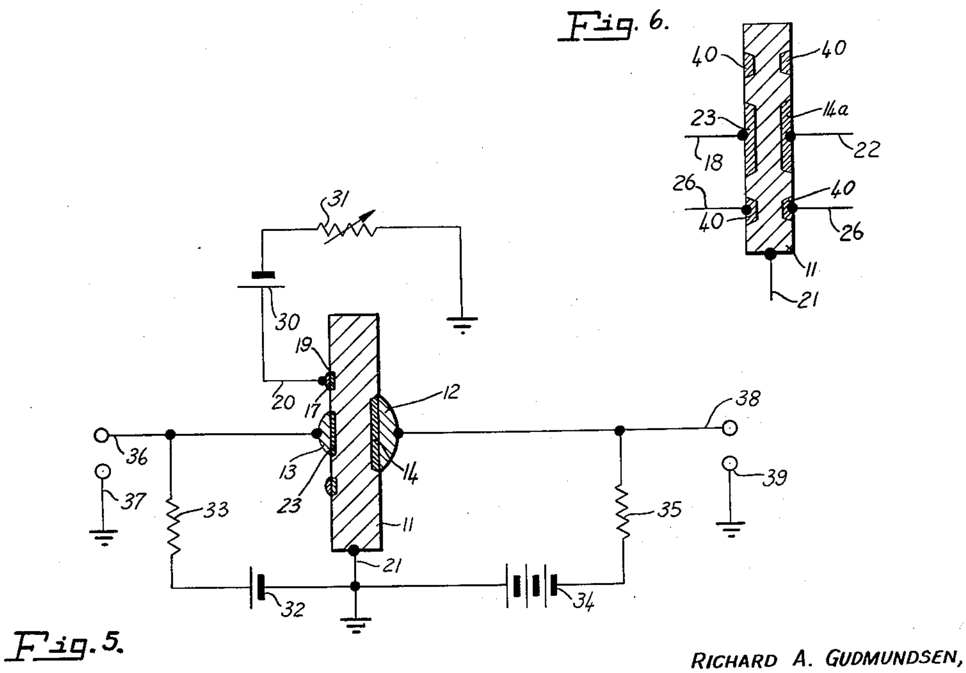
FIG. 5 is a circuit diagram showing how the device of the present invention may be utilized as a current amplifier.
FIG. 6 is a cross-sectional view of an embodiment of a transistor of the invention.

In FIG. 6 there is shown a cross-sectional view of an embodiment of a transistor according to the present invention.

Unlike the devices as shown in FIGS. 1–4 the transistor of FIG. 6 has its collector and emitter regions 14 and 23 of exactly the same size. Further, an auxiliary emitter region 40 is disposed about the collector and about the emitter region on each side of the base region 11. This auxiliary emitter may take either the form of the continuous ring of the FIG. 1 device or the series of concentrically circular regions of the FIG. 3 transistor. However, the same type of auxiliary emitter must be used about both emitter and collector regions.

A device as above-described may be operated with either the collector as the emitter or vice versa. In other words, it is completely symmetrical and hence may be operated in an electric circuit in either direction merely by changing the biasing potentials. Such a device has many uses in switching circuits as it has a high $\alpha$ in either direction.

FIG. 5 shows a circuit diagram of a typical arrangement utilizing the transistor of FIGS. 1 and 2 or that of FIGS. 3 and 4 as a current amplifier. The auxiliary emitter region 19 is forward biased by battery 30, the positive terminal of which is connected to emitter region 19 through pellet 17 and auxiliary emitter electrode 20. The negative terminal of battery 30 is connected through variable resistor 31 to ground. First emitter region 23 is also forward biased by battery 32 through current limiting resistor 33, the negative terminal of the battery being grounded.

Collector region 23 on the other hand is negatively biased by battery 34 through current limiting resistor 35, the positive terminal of battery 34 being grounded. Finally the base region 11 is itself connected directly to ground through base electrode 21. Input terminals 36 and 37 are connected between the first emitter 23 and the base 11 or ground while the output terminals 38 and 39 are connected between the collector 14 and the base 11 or ground.

The operation of the transistor of the present invention is as follows:

Emitter region 23 being forward biased by battery 32 through resistor 33 injects holes into base region 11. As minority carriers are emitted from the emitter region 23 into the base region 11 they diffuse according to the laws of diffusion away from regions of high minority carrier concentration and toward regions of low concentration. Typical regions of low minority carrier concentration are the collector region 14 where the minority carriers, holes in the present example, are extracted from the base region 11 by the reverse-biased junction 15. Another region of low minority carrier concentration is the surface region surrounding the first or signal emitter region 23 where the holes can be recombined by the phenomenon of surface recombination, or by lateral diffusion radially out into the base region 11. These minority carriers which are recombined by either of the latter two effects reduce the transport efficiency of the transistor.

The action of the auxiliary emitter 16 tends to decrease the number of such recombination losses. This is accomplished by opposing the diffusion field from the signal emitter region 23 by the even stronger diffusion field produced by carriers being injected into the base region 11 by the auxiliary emitter 16, i.e., these extra carriers decrease the lateral diffusion losses of the minority carriers by decreasing the lateral diffusion gradient.

It might be mentioned in passing that the effect upon the conductivity of the base region by the injection of minority carriers from the auxiliary emitter is localized in the vicinity of such emitter and is not pronounced in the vicinity of the signal emitter, hence it does not adversely affect $\gamma$ and/or the collector breakdown voltage.

From the above discussion it follows that a signal applied to signal emitter 23 across input terminals 36 and 37 will be more greatly amplified at the output terminals 38 and 39. To this end it is desirable that the auxiliary emitter voltage applied by source 30 to emitter 19 be of a value greater than that of biasing battery 32.

There has thus been disclosed a new and novel reversible semiconductor transistor device which has a relatively high current gain, and whose gain may be controlled by control of the current of an auxiliary emitter.

What is claimed as new is:

A fused-junction transistor comprising: a base region composed of an active impurity-doped semiconductor material of one conductivity type; emitter and collector regions of an active impurity-doped semiconductor material of the opposite conductivity type bonded to and in rectifying contact with said base region and being symmetrically disposed on opposite surfaces of said base region, said emitter and collector regions being of substantially the same size; first and second regions of an active impurity-doped semiconductor material of the same conductivity type as that of said emitter and collector regions, said first and second regions each comprising a circular series of regions spaced a distance less than a diffusion length for minority carriers from each other end being disposed about and substantially encircling said emitter and collector regions respectively and being bonded to and in rectifying contact with said base region; and an ohmic connection to said base region spaced from said rectifying contacts.

References Cited in the file of this patent

UNITED STATES PATENTS

| | | |
|---|---|---|
| 2,612,567 | Stuetzer | Sept. 30, 1952 |
| 2,672,528 | Shockley | Mar. 16, 1954 |
| 2,701,281 | White et al. | Feb. 1, 1955 |
| 2,754,431 | Johnson | July 10, 1956 |
| 2,777,101 | Cohen | Jan. 8, 1957 |
| 2,777,974 | Brattain et al. | Jan. 15, 1957 |
| 2,801,347 | Dodge | July 30, 1957 |
| 2,801,348 | Pankove | July 30, 1957 |
| 2,847,583 | Hung | Aug. 12, 1958 |
| 2,915,646 | Kurshan | Dec. 1, 1959 |
| 2,929,999 | Bradley et al. | Mar. 22, 1960 |